US012663733B2

(12) United States Patent
Van Hal et al.

(10) Patent No.: US 12,663,733 B2
(45) Date of Patent: Jun. 23, 2026

(54) LITHOGRAPHY APPARATUS WITH IMPROVED STABILITY

(71) Applicant: ASML Netherlands B.V., Veldhoven (NL)

(72) Inventors: Paulus Albertus Van Hal, Waalre (NL); Diego Millo, Amsterdam (NL); Aleksandar Nikolov Zdravkov, Eindhoven (NL); Marcus Adrianus Van De Kerkhof, Helmond (NL)

(73) Assignee: ASML Netherlands B.V., Veldoven (NL)

( * ) Notice: Subject to any disclaimer, the term of this patent is extended or adjusted under 35 U.S.C. 154(b) by 951 days.

(21) Appl. No.: 17/780,906

(22) PCT Filed: Oct. 29, 2020

(86) PCT No.: PCT/EP2020/080408
§ 371 (c)(1),
(2) Date: May 27, 2022

(87) PCT Pub. No.: WO2021/104791
PCT Pub. Date: Jun. 3, 2021

(65) Prior Publication Data
US 2023/0024490 A1      Jan. 26, 2023

(30) Foreign Application Priority Data
Nov. 29, 2019    (EP) ..................................... 19212411

(51) Int. Cl.
*G03F 7/00*          (2006.01)
*G03F 7/16*          (2006.01)

(52) U.S. Cl.
CPC ............ *G03F 7/7095* (2013.01); *G03F 7/165* (2013.01); *G03F 7/707* (2013.01)

(58) Field of Classification Search
USPC ................. 118/500, 641–643, 504, 720, 728
See application file for complete search history.

(56) References Cited

U.S. PATENT DOCUMENTS

| | | | |
|---|---|---|---|
| 5,077,085 A | | 12/1991 | Schnur et al. |
| 5,728,431 A | * | 3/1998 | Bergbreiter .............. B05D 7/16 |
| | | | 427/551 |

(Continued)

FOREIGN PATENT DOCUMENTS

| | | |
|---|---|---|
| EP | 3 299 889 A1 | 3/2018 |
| GB | 2 371 248 A | 7/2002 |

(Continued)

OTHER PUBLICATIONS

International Search Report and Written Opinion of the International Searching Authority directed to related International Patent Application No. PCT/EP2020/080408, mailed Feb. 17, 2021; 11 pages.

(Continued)

*Primary Examiner* — Yewebdar T Tadesse
(74) *Attorney, Agent, or Firm* — FINNEGAN, HENDERSON, FARABOW, GARRETT & DUNNER LLP

(57) ABSTRACT

The present invention relates to methods for improving the resistance of lithography substrate holders to corrosion. The present invention also relates to systems comprising lithography substrate holders with improved corrosion resistance, and to methods of fabricating devices, e.g. integrated circuits, using such systems. The present invention also relates to substrates with backsides configured to preferentially corrode when used in lithography. The present invention has particular use in connection with lithographic apparatus for fabricating devices, for example integrated circuits.

5 Claims, 2 Drawing Sheets

(56) References Cited

U.S. PATENT DOCUMENTS

| | | | |
|---|---|---|---|
| 6,952,253 B2 | 10/2005 | Lof et al. | |
| 2005/0127461 A1 | 6/2005 | Dey et al. | |
| 2007/0098902 A1* | 5/2007 | Engstrom | B82Y 30/00 |
| | | | 427/337 |
| 2008/0087883 A1* | 4/2008 | Suwa | H10K 10/84 |
| | | | 257/40 |
| 2011/0237053 A1 | 9/2011 | Baker et al. | |
| 2013/0094009 A1 | 4/2013 | Lafarre et al. | |
| 2015/0325263 A1 | 11/2015 | Stoebe et al. | |

FOREIGN PATENT DOCUMENTS

| | | |
|---|---|---|
| WO | WO 2003/033127 A2 | 4/2003 |
| WO | WO 2016/183574 A1 | 11/2016 |

OTHER PUBLICATIONS

International Preliminary Report on Patentability directed to related International Patent Application No. PCT/EP2020/080408, issued May 17, 2022; 8 pages.

De Boer et al., "Tuning of Metal work Functions with Self-Assembled Monolayers," Advanced Materials, vol. 17, No. 5, Mar. 8, 2005; pp. 621-625.

Rietwyk et al., "Work function and electron affinity of the fluorine-terminated (100) diamond surface," Applied Physics Letters, vol. 102, Mar. 8, 2013; 4 pages.

Arefi et al., "Chemical Trends in the Work Function of Modified Si(111) Surfaces: A DFT Study," The Journal of Physical Chemistry C, vol. 118, No. 26, Jun. 10, 2014; pp. 14346-14354.

Tarditi et al., "Controlling the work function of a diamond-like carbon surface by fluorination with XeF2," Journal of Vacuum Science & Technology A, vol. 28, No. 5, Sep. 3, 2010; pp. 1250-1254.

Smentkowski et al., "Fluorination of diamond—$C_4F_9I$ and $CF_3I$ photochemistry on diamond (100)," Surface Science, vol. 370, Jan. 10, 1997; pp. 209-231.

Yamamoto, Shigehiko "Fundamental physics of vacuum electron sources," Reports on Progress in Physics, vol. 69, No. 1, Nov. 21, 2005; pp. 181-232.

Mitraka et al., "Oxygen-induced doping on reduced PEDOT," Journal of Materials Chemistry A, vol. 5, No. 9, Mar. 2017; pp. 4404-4412.

* cited by examiner

LITHOGRAPHY APPARATUS WITH IMPROVED STABILITY

CROSS-REFERENCE TO RELATED APPLICATIONS

This application claims priority of EP application 19212411.3 which was filed on Nov. 29, 2019 and which is incorporated herein in its entirety by reference.

FIELD

The present invention relates to lithographic apparatus, to methods of making such apparatus and to manufacturing devices, for example integrated circuits, using such apparatus.

BACKGROUND TO THE INVENTION

A lithographic apparatus is a machine constructed to apply a desired pattern onto a substrate. A lithographic apparatus can be used, for example, in the manufacture of devices, for example integrated circuits (ICs). A lithographic apparatus may for example project a pattern from a patterning device (e.g., a mask) onto a layer of radiation-sensitive material (resist) provided on a substrate.

The substrate in a lithographic apparatus is typically supported by a support mechanism, referred to as a substrate holder. When the substrate is a silicon wafer (for example, during integrated circuit manufacture), the support mechanism/substrate holder is typically referred to as a wafertable.

The wavelength of radiation used by a lithographic apparatus to project a pattern onto a substrate determines the minimum size of features that can be formed on that substrate. A lithographic apparatus that uses EUV radiation, that is electromagnetic radiation having a wavelength within the range 4-20 nm, may be used to form smaller features on a substrate than a lithographic apparatus using deep ultraviolet (DUV) radiation (for example with a wavelength of 193 nm).

As the size of features to be formed in a lithographic process reduces, the performance requirements on all aspects of the lithographic apparatus and materials become stricter.

Substrate holders used during device fabrication typically comprise burls, which reduce the influence of contamination by particles on the backside of the substrate.

Typical semiconductor substrates have a thin layer of silicon, for example $SiO_x$ or $Si_xN_y$, on the backside of the substrate (e.g. the wafer backside), which can lead to the formation of Si—OH groups at the surface. This results in substrate backside surfaces that have high surface energies.

Before loading a substrate into the lithography apparatus, the backside of the substrate is cleaned with a $H_2O$ rinse with scrubbing on the central part of the substrate to remove contaminant particles. The substrate is spin dried, leaving adsorbed monolayers of $H_2O$ on the substrate backside. Due to the streaming potential, this water rinse procedure results in the formation of surface charges on the substrate backside. Upon loading the substrate onto the substrate holder, residual water is thus present between the substrate backside and the burls of the substrate holder.

Galvanic coupling between the substrate backside and substrate holder materials can occur when the two different materials are brought into electrical contact in the presence of water. The most active material oxidises, while the most noble one is protected.

Thus, contact between the water and the burl material can lead to electrochemical corrosion of the burl. Over time, the burl may change height and thus no longer meet the strict performance requirements required for lithographic apparatus. The substrate holder must then be replaced. Minimising the rate of burl corrosion is therefore key to maximising substrate holder life and efficiency of device production.

One method of reducing burl reactivity is to apply a cathodic overpotential to the burls to prevent oxidation. However, as taught in Mitraka et al. *J. Mater. Chem. A,* 2017, 5:4404-4412, applying a cathodic overpotential to the burls in the presence of air may lead to the formation of reactive oxygen species that may corrode the burl.

Another method of reducing burl reactivity is to apply an anodic overpotential to create a passivation layer, which seals the underlying surface and prevents further oxidation. However, passivation layers are only applicable for certain metallic substrates, where the corresponding metal oxide forms a closed oxide layer which is able to prevent further corrosion of the underlying metal layer. For many metals, the metal oxide does not form a closed layer and further corrosion of the underlying metal surface can occur. For carbon-based materials such as DLC, the corrosion of the carbon-based layers may result in dissolution of the oxide, either in solution or possibly in gaseous species such as $CO_2$, $H_2O$ and CO.

Thus, neither applying a cathodic overpotential nor creating a passivation layer are generally applicable to all substrate holder materials.

SUMMARY OF THE INVENTION

In view of the above, there remains a need to develop improved methods for increasing the resistance of substrate holders (e.g. wafertables) to corrosion. There is also a need for systems comprising such improved substrate holders.

The present invention relates to a method for improving the resistance of a lithography substrate holder to corrosion, the method comprising:

a. applying a first self-assembled monolayer (SAM A) to at least a portion of the burls of the substrate holder; and/or b. applying a second self-assembled monolayer (SAM B) to the backside of a substrate intended for use with the lithography substrate holder;

wherein SAM A increases the work function of the burls of the substrate holder, and wherein SAM B decreases the work function of the substrate backside material.

The present invention also relates to a method of fabricating a device, the method comprising:

a. exposing a substrate supported by a substrate holder to a radiation beam to produce an exposed substrate; and b. processing the exposed substrate to produce a device, wherein the surface of the substrate holder comprises a first self-assembled monolayer (SAM A) and/or the backside of the substrate comprises a second self-assembled monolayer (SAM B);

wherein SAM A comprises a dipole in the direction pointing away from the surface of the substrate holder, and wherein SAM B comprises a dipole in the direction pointing towards the surface of the substrate.

The present invention also relates to a system comprising a lithography substrate holder, wherein at least a portion of the burls of the substrate holder comprise a self-assembled monolayer (SAM A), wherein SAM A comprises a dipole in the direction pointing away from the surface of the substrate holder.

The present invention also relates to a substrate with a backside configured to act as a sacrificial anode when supported by a substrate holder in a lithographic apparatus, comprising a self-assembled monolayer (SAM B) on the backside of the substrate, wherein SAM B comprises a dipole pointing towards the substrate backside, wherein the nobility of the substrate backside is lower than the nobility of an equivalent substrate backside without SAM B.

The present invention also relates to a lithography apparatus configured to apply a radiation beam to a substrate, and configured to apply a self-assembled monolayer (SAM B) to the backside of the substrate.

Such methods and systems minimise the rate of substrate holder corrosion and thus reduce the frequency at which substrate holders must be replaced. This reduces the frequency of maintenance of lithographic apparatus, increasing throughput of the lithographic apparatus and the efficiency of device production

DETAILED DESCRIPTION OF THE INVENTION

Figure 1:
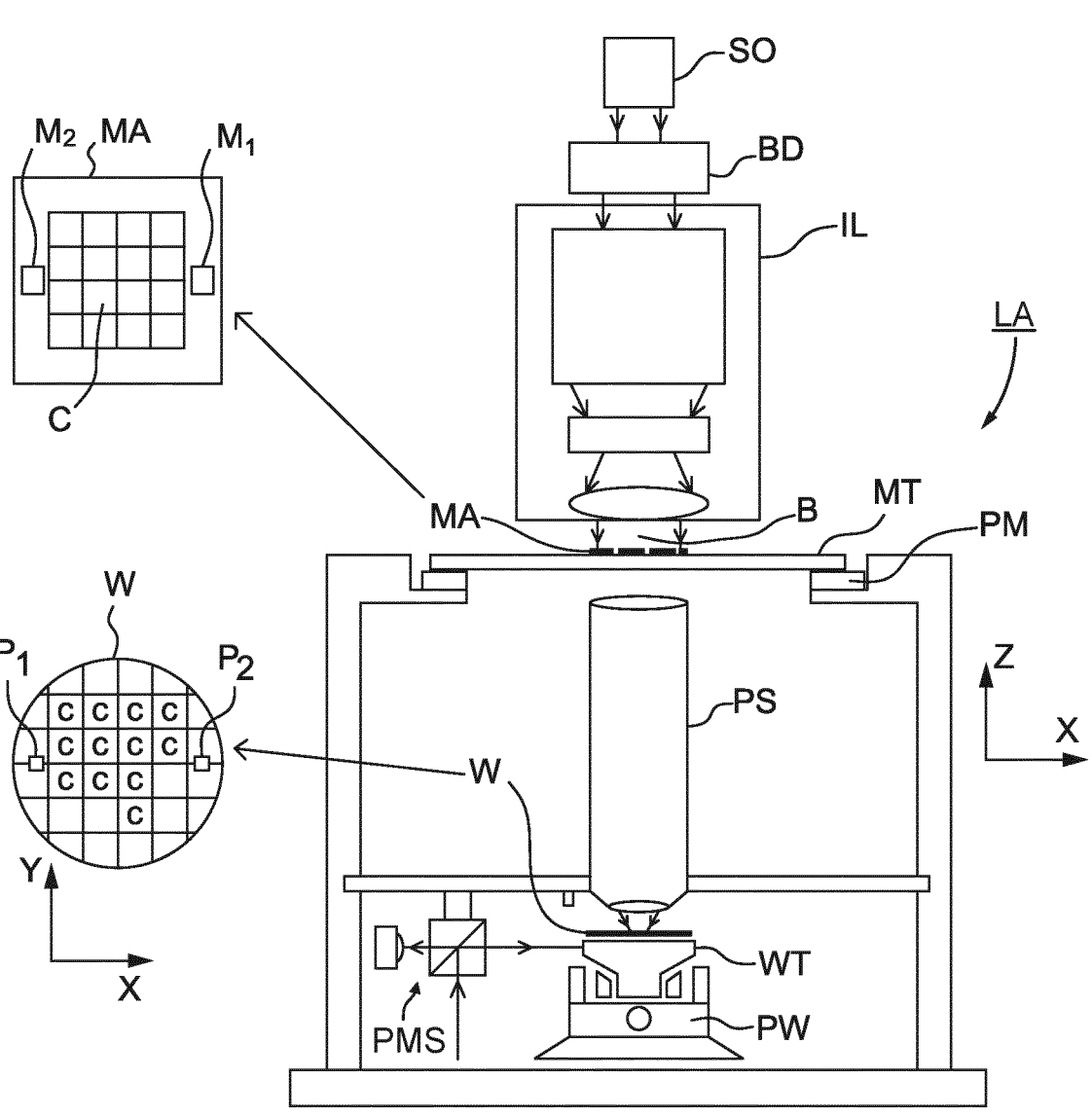
FIG. 1 is a schematic illustration of a lithographic system comprising a lithographic apparatus and a radiation source.

FIG. 1 schematically depicts a lithographic apparatus LA. The lithographic apparatus includes an illumination system (also referred to as illuminator) IL configured to condition a radiation beam B (e.g., EUV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In a lithographic apparatus it is necessary to position with great accuracy the upper surface of a substrate or wafer to be exposed in the plane of best focus of the aerial image of the pattern projected by the projection system. To achieve this, the substrate or wafer can be held on a substrate holder or wafertable. The surface of the substrate holder that supports the substrate can be provided with a plurality of burls whose distal ends can be coplanar in a nominal support plane. The burls, though numerous, may be small in cross-sectional area parallel to the support plane so that the total cross-sectional area of their distal ends is a few percent, e.g. less than 5%, of the surface area of the substrate. The gas pressure in the space between the substrate holder and the substrate may be reduced relative to the pressure above the substrate to create a force clamping the substrate to the substrate holder.

Figure 2:
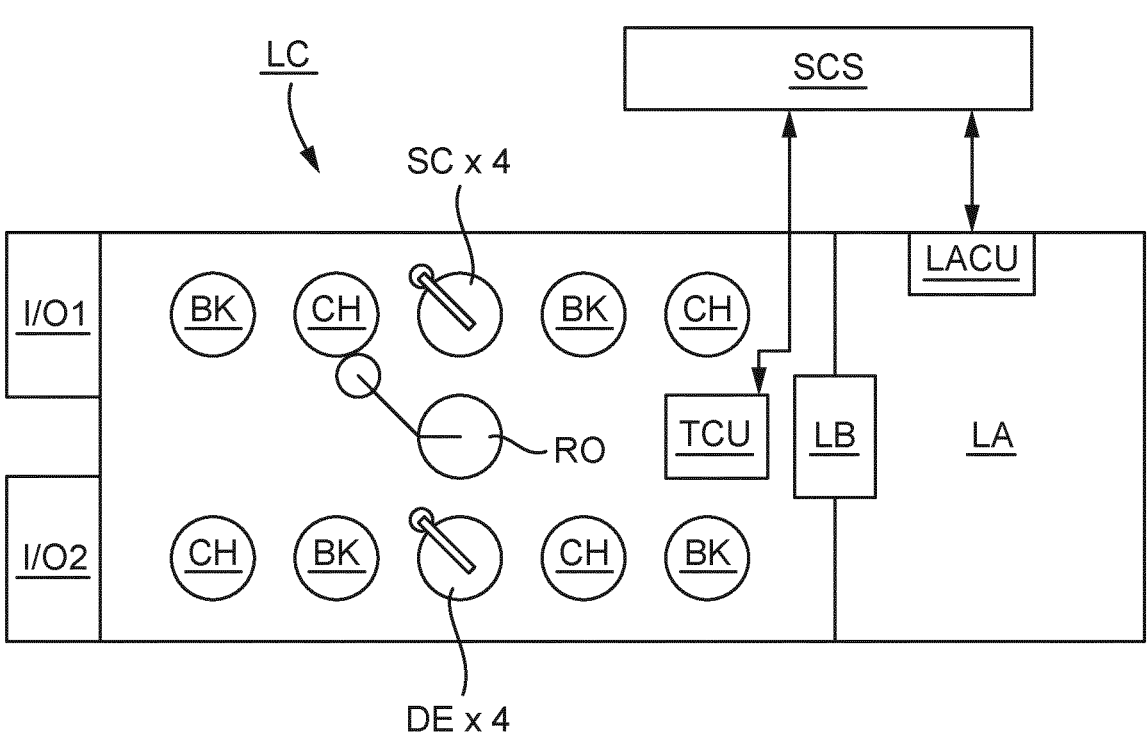
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

A wafer as discussed herein is one example of a substrate that may be supported by a substrate holder. When the substrate is referred to as a wafer, the substrate holder is typically referred to as a wafertable.

The present invention arises from the finding that it is possible to improve the resistance of lithography wafertables to corrosion by increasing the difference in work function between the burl material and the wafer backside material using self-assembled monolayers (SAMs). Increasing the nobility of the burls of the wafertable and/or decreasing the nobility of the wafer backside means that in the case of galvanic coupling between the wafer backside and burl material, the wafer backside will act as a sacrificial anode i.e. the wafer backside will preferentially corrode rather than the burls. The burl material is therefore protected from corrosion.

The term "work function" used herein refers to the minimum energy required to remove an electron from a solid to a point in the vacuum immediately outside the solid surface. In general, an increase in the work function of a surface increases the nobility of the surface (and decreases the reactivity of the surface). Conversely, a decrease in the work function of a surface decreases the nobility of the surface (and increases the reactivity of the surface). Quantification of the change in work function of the materials described herein may be measured using Kelvin probe microscopy or ultraviolet photoelectron spectroscopy (UPS). Both techniques are well known in the art.

The work function of the surface of a solid material may be modified by the adsorption of gas atoms and molecules from the environment. The degree of modification depends on surface conditions, for example the surface temperature and existence or absence of previous surface treatments.

When an atom adsorbs on a clean surface an electric potential builds up on the surface, which either increases or decreased the work function of the substrate. When adsorbed molecules are all oriented in the same manner, the work function of the substrate is also modified. An electric dipole field is produced at the adsorption site, which modifies the work function of the substrate accordingly.

An electric dipole has a dipole moment vector:

$$P = q \times d,$$

6 where P=the electric dipole moment vector
q=the magnitude of the charge
d=the displacement vector between the charges
The surface potential created by such a dipole moment is given by:

$$\Delta V = \frac{Q}{C},$$

where $\Delta V$ = the surface potential $Q$ = total charge (given by the product of the elemental charge $q$ of the dipole and its concentration $\sigma - Q = q \times \sigma$), and $C$ = the electrostatic capacitance.

Assuming a parallel plate configuration, the capacitance is given by:

$$C = \varepsilon_0 \times \frac{S}{d}, \text{ where } S = \text{the area of the plates.}$$

Thus, the surface potential is given by:

$$\Delta V = \frac{q \times d \times \sigma}{\varepsilon_0} = \frac{P \times \sigma}{\varepsilon_0}.$$

The polarity of $\Delta V$ can take either a positive or a negative sign depending on the polarity of adsorbed species. The change in the work function by atom adsorption is, thus, given by:

$$\Delta \phi = -\Delta V.$$

When a self-assembled monolayer (SAM) is added onto a semi-conductor or metallic species, the work function can be tuned based on the size and direction of the dipole moment of the monolayer.

Changes of work function of the substrate of around 0.5-1 eV can be obtained.

Hence, semiconducting materials and metals can be coated with a SAM to make the surface either more noble (i.e. less reactive) or less noble (i.e. more reactive).

The term "self-assembled monolayer" (SAM) used herein refers to an atomic or molecular assembly formed spontaneously on a surface by adsorption of SAM precursor molecules onto the surface. SAM precursor molecules typically comprise a head-group and a tail-group. Head-groups of the SAM precursor molecules are able to chemisorb onto a substrate. As more head-groups chemisorb to the surface, the tail-groups begin to self-organise, pointing away from the surface until a monolayer is formed on the surface of the substrate. The "end-group" of a SAM is the final group of the tail-group i.e. the group of the SAM that is furthest away from the surface of the substrate to which the SAM is adsorbed. When the SAM is an atomic assembly, the end-group of the SAM is a single atom bonded directly to the surface, for example an —F atom bonded to a DLC surface.

The tail-group of the SAM can be saturated or unsaturated. When the tail-group is unsaturated, it can comprise a conjugated structure, for example a phenyl group and/or a heterocyclic group, including heterocyclic groups comprising S, N and/or O atoms, for example a thiophene group. The tail-group of the SAM can also comprise one or more azo groups. SAMs comprising one or more azo groups can be manipulated with light such that the one or more azo groups form either the trans or cis configuration. Due to the different orientations of the cis and trans configurations of azo groups, the dipole moment of SAMs comprising such groups can be modified.

The dipole moment generated by a SAM is a function of the electronegativity of the substituents of the SAM, and the size of the SAM. It is also important for the SAM molecules or atoms to orient in the same direction, such that a total dipole moment is obtained which alters the work function of the surface.

Typically, more ordered monolayers (and thus larger dipoles) are seen for SAMs with alkyl tail-groups with chain lengths in the range of from about 10 carbon atoms to about 22 carbon atoms. Very small SAMs (1-2 carbon atoms) are also able to orient in the same direction, as the molecules are too short to lay flat against the surface to which the SAM is adsorbed.

SAMs with a chain length of from 2 carbon atoms to about 8 carbon atoms may be able to lay flat against the surface and are less to likely to orient in the same direction. However, for conjugated SAMs, pi-pi interactions can exist between layers and keep the SAMs oriented in the same direction, even for relatively small SAMs.

The SAMs used in the present invention may therefore be of any length, provided that they are able to orient such that a net dipole moment is present.

Typically, SAMs with halogenated end-groups and/or tail-group substituents result in a dipole moment in the direction pointing away from the surface to which the SAM is adsorbed, increasing the work function of the surface and making it more stable. For example, as shown in "*Tuning of Metal workfunctions with SAMs*", *Adv Mater* 2005, 17(5), 621, a SAM with a fluorinated end-group bonded to a gold surface changes the work function of gold from 4.8 eV to 5.5 eV i.e. the surface is made more noble and less susceptible to oxidation.

Typically, SAMs with alkylated end-groups and/or tail-group substituents result in a dipole moment in the direction pointing towards the surface to which the SAM is adsorbed, lowering the work function and making the surface less stable. For example, as shown in "*Tuning of Metal workfunctions with SAMs*", *Adv Mater* 2005, 17(5), 621, a SAM with a —CH$_3$ group as the end-group on gold changes the work function of gold from 4.8 eV to 4.1 eV i.e. the surface is made less noble and more susceptible to oxidation.

Similar increases and decreases in work function are observed when applying SAMs to Si-based surfaces and for DLC-based surfaces, which are typically used as materials for the wafer backside and the burls of the wafertable during lithography. For example, FIG. 5 of "*Chemical Trends in the Work Function of Modified Si(111) Surfaces: A DFT Study*", *J. Phys. Chem. C* 2014, 118, 14346-14354 shows that having electronegative groups (—I, —Br, —Cl and —F) as the end-groups of SAMs attached to a Si(111) surface increases the work function of the surface relative to an untreated H—Si(111) surface. Conversely, the figure shows that having —BH$_2$, —CH$_3$, —NH$_2$ or —OH groups as the end-group of SAMs attached to as Si(111) surface decreases the work function of the surface relative to an untreated H—Si (111) surface.

The reactivity of a surface can thus be either increased or decreased by applying specific SAMs to tune the surface's work function.

The present invention provides a method to tune the reactivity of the components of a lithographic apparatus such that the burl material is more noble than the backside of wafers supported by the wafertable during operation of the lithographic apparatus. Thus, oxidation will preferentially occur at the wafer backside (i.e. the wafer backside acts as a sacrificial anode), eliminating or reducing the rate of corrosion of the wafertable and extending its lifetime.

To achieve this aim, SAMs can be applied to one or both of a wafer backside, and to the burls of the wafertable of the lithographic apparatus.

The wafer can be made of any semiconducting material known in the art that may be used to produce wafers. For example, the wafer may be a silicon wafer, a silicon carbide wafer, a gallium nitride wafer or a gallium arsenide wafer. Preferably, the wafer is a silicon wafer or a silicon carbide wafer.

The material of the burls preferably comprises one or more of DLC, diamond, graphite, SiSiC, SiC and/or CrN.

When a SAM is applied to the burls, the SAM preferably has a dipole in the direction pointing away from the surface of the wafertable i.e. it is a SAM that increases the work function of the burls. In this case, the end-group of the SAM is preferably —BH$_2$, —COOH, —CN, —F, —Cl, —Br, —I, —CX$_3$, —CHX$_2$ or —CH$_2$X, wherein each instance of X is independently selected from F, Cl, Br or I. Preferably, the end-group of the SAM is —F, —Cl, —CF$_3$, —CHF$_2$, —CH$_2$F or CCl$_3$, and most preferably —CF$_3$ or —F. When a SAM is applied to the burls, the substituents of the tail-group of the SAM may also comprise electronegative substituents, preferably one or more substituents selected from —BH$_2$, —COOH, —CN, —F, —Cl, —Br, —I, —CX$_3$, —CHX$_2$ or —CH$_2$X, wherein each instance of X is independently selected from F, Cl, Br or I. Most preferably, the substituents of the tail-group comprise one or more substituents selected from —F, —Cl, —CF$_3$, —CHF$_2$, —CH$_2$F or CCl$_3$, and most preferably —CF$_3$ or —F.

When a SAM is applied to the wafer backside, the SAM preferably has a dipole in the direction pointing towards the surface of the wafer backside i.e. it is a SAM that decreases the work function of the wafer backside. In this case, the end-group of the SAM is preferably —CH$_3$, —NH$_2$ or —OH, and most preferably —CH$_3$. When a SAM is applied to the wafer backside, the tail-group of the SAM preferably comprises one or more substituents selected from —CH$_3$, —NH$_2$ or —OH, and most preferably —CH$_3$.

In an embodiment of the present invention, a method is provided for improving the resistance of a lithography substrate holder (such as a wafertable) to corrosion by increasing the nobility of the burls of the substrate holder and/or decreasing the nobility of a substrate (such as a wafer) backside, such that the substrate backside acts as a sacrificial anode during operation of the lithography substrate holder, the method comprising:

a. applying a first self-assembled monolayer (SAM A) to at least a portion of the burls of the substrate holder; and/or b. applying a second self-assembled monolayer (SAM B) to the substrate backside;

wherein SAM A increases the work function of the burls of the substrate holder, and wherein SAM B decreases the work function of the substrate backside material.

As set out above, applying specific SAMs to a surface (for example a Si surface) allows the work function of the surface to be modified. Increases and decreases of up to 1 eV can be achieved, and so applying SAMs to the surface of two materials in electrochemical contact can be used to modulate the reactivity of the surfaces.

In addition to modulating the work function, applying SAMs to the surface of the burls of the wafertable and/or the wafer backside lowers the surface energy of the burls and/or the wafer backside. For example, SAMs with either —F or —CH₃ end-groups result in hydrophobic surfaces. This provides an additional benefit by both reducing the quantity of water that is retained on the surface of the wafer backside following spin drying, and the quantity of residual water that exists between the wafer backside and the burls of the wafertable. There is therefore less water present to drive electrochemical corrosion.

The SAMs can be applied by any method in the art, for example by vapour phase reaction (i.e. the SAM precursor molecule is applied in the gaseous phase) or by wet chemical application (i.e. the SAM precursor molecule is applied in the liquid phase). The SAM can also be contact printed onto the burls of the wafertable or the wafer backside surface. Thus, the relative reactivity of the burl material and/or the wafer backside can be tuned locally if desired.

Various techniques have been reported for the preparation of F-terminated diamond surfaces. These have been based on the exposure of surfaces to fluorine-containing gases, molecules (fluorocarbons), and plasmas (CF, CHF₃, and C₄F₈), for example as exemplified in *"Fluorination of diamond—C4F9I and CF3I photochemistry on diamond (100)." Surface Science.* 370. 209-231.

As an example of vapour phase deposition, gaseous $XeF_2$ can be used to form a fluorinated SAM on the surface of DLC. FIG. 3 of *"Controlling the work function of a diamond-like carbon surface by fluorination with $XeF_2$", Journal of Vacuum Science & Technology A* 28, 1250 (2010) shows that the work function of a DLC surface increases as fluorine surface coverage increases as the surface is exposed to $XeF_2$. An extremely high work function of 7.24 eV was observed in *"Work function and electron affinity of the fluorine-terminated* (100) *diamond surface", Applied Physics Letters* 102, 091604 (2013) for a fluorine-terminated (100) diamond surface prepared by exposure of the surface to dissociated $XeF_2$, demonstrating the possibility of significantly increasing the nobility of a surface by utilising a monolayer.

The SAMs on the surface of the burls and/or wafer backside can be renewed if required, for example if the existing SAM is damaged by mechanochemical wear. The SAM can be renewed by vapour phase reaction of a SAM precursor molecule with the surface to be renewed (i.e. by application of the SAM precursor molecule in the gaseous phase), by wet chemical application of a SAM precursor molecule with the surface to be renewed (i.e. by application of the SAM precursor molecule in the liquid phase), or by micro-contact printing to deposit the SAM in a specific region of the wafertable and/or wafer backside.

The present invention is also concerned with providing lithography systems comprising a lithography wafertable comprising burls with improved corrosion resistance, wherein the burls comprise a SAM surface which decreases the reactivity of the burls relative to the same burls not covered by the SAM. When in operation, the wafer backside supported by the wafertable acts as a sacrificial anode, protecting the wafertable from corrosion.

In this case, the dipole moment of the SAM is preferably in the direction pointing away from the surface of the wafertable, increasing the work function of the burls of the wafertable and making the surface more stable in comparison to the same surface without the SAM. Preferably, the end-group of the SAM is —BH₂, —COOH, —CN, —F, —Cl, —Br, —I, —CX₃, —CHX₂ or —CH₂X, wherein each instance of X is independently selected from F, Cl, Br or I. Preferably, the end-group of the SAM is —F, —Cl, —CF₃, —CHF₂, —CH₂F or CCl₃, and most preferably —CF₃ or —F. The substituents of the tail-group of the SAM may also comprise electronegative substituents, preferably one or more substituents selected from —BH₂, —COOH, —CN, —F, —Cl, —Br, —I, —CX₃, —CHX₂ or —CH₂X, wherein each instance of X is independently selected from F, Cl, Br or I. Most preferably, the substituents of the tail-group comprise one or more substituents selected from —F, —Cl, —CF₃, —CHF₂, —CH₂F or CCl₃, and most preferably —CF₃ or —F.

The present invention is also concerned with providing a wafer with a backside configured to act as a sacrificial anode when supported by a wafertable in a lithographic apparatus, wherein the backside of the wafer is coated with a SAM, wherein the SAM increases the reactivity of the wafer backside relative to the same material not covered by the SAM, thus making the wafer backside less noble as compared to the burls of the wafertable.

In this case, the dipole moment of the SAM is preferably in the direction pointing towards the surface of the wafer backside, decreasing the work function and making the surface less stable in comparison to the same surface without the SAM. Preferably, the end-group of the SAM is —CH₃, —NH₂ or —OH, and most preferably —CH₃.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

While specific embodiments of the invention have been described above, it will be appreciated that the invention may be practiced otherwise than as described. Aspects of the invention are set out in the clauses below.

1. A method for improving the resistance of a lithography substrate holder to corrosion, the method comprising: applying a first self-assembled monolayer (SAM A) to at least a portion of the burls of the substrate holder; and/or applying a second self-assembled monolayer (SAM B) to the backside of a substrate intended for use with the lithography substrate holder; wherein SAM A increases the work function of the burls of the substrate holder, and wherein SAM B decreases the work function of the substrate backside material.

2. The method of clause 1, wherein the tail-group of SAM A comprises one or more substituents selected from —BH2, —COOH, —CN, —F, —Cl, —Br, —I, —CX3, —CHX2 or —CH2X, wherein each instance of X is independently selected from F, Cl, Br or I.

3. The method of clause 1 or clause 2, wherein the end-group of SAM A is —BH₂, —COOH, —CN, —F, —Cl, —Br, —I, —CX3, —CHX2 or —CH2X, wherein each instance of X is independently selected from F, Cl, Br or I.

4. The method of any one of clauses 1 to 3, wherein the tail-group of SAM B comprises one or more substituents selected from —CH3, —NH2 or —OH.

5. The method of any one of clauses 1 to 4, wherein the end-group of SAM B is —CH3, —NH2 or —OH.

6. The method of any one of clauses 1 to 5, wherein SAM A and/or SAM B is applied by vapour phase reaction, wet chemical application or contact printing.

7. The method of any one of clauses 1 to 6, wherein the burl comprises one or more of diamond-like carbon (DLC), diamond, graphite, SiSiC, SiC and/or CrN.

8. The method of any one of clauses 1 to 7, wherein the substrate is a silicon wafer, a silicon carbide wafer, a gallium nitride wafer or a gallium arsenide wafer.

9. A method of fabricating a device, the method comprising: exposing a substrate supported by a substrate holder to a radiation beam to produce an exposed substrate; and processing the exposed substrate to produce a device, wherein the surface of the substrate holder comprises a first self-assembled monolayer (SAM A) and/or the backside of the substrate comprises a second self-assembled monolayer (SAM B); wherein SAM A comprises a dipole in the direction pointing away from the surface of the substrate holder, and wherein SAM B comprises a dipole in the direction pointing towards the surface of the substrate.

10. The method of clause 9, wherein the tail-group of SAM A comprises one or more substituents selected from —BH2, —COOH, —CN, —F, —Cl, —Br, —I, —CX3, —CHX2 or —CH2X, wherein each instance of X is independently selected from F, Cl, Br or I.

11. The method of clause 9 or clause 10, wherein the end-group of SAM A is —BH2, —COOH, —CN, —F, —Cl, —Br, —I, —CX3, —CHX2 or —CH2X, wherein each instance of X is independently selected from F, Cl, Br or I.

12. The method of any one of clauses 9 to 11, wherein the tail-group of SAM B comprises one or more substituents selected from —CH3, —NH2 or —OH.

13. The method of any one of clauses 9 to 12, wherein the end-group of SAM B is —CH3, —NH2 or —OH.

14. The method of any one of clauses 9 to 13, wherein the backside of the substrate acts as a sacrificial anode when supported by the substrate holder.

15. A system comprising a lithography substrate holder, wherein at least a portion of the burls of the substrate holder comprise a self-assembled monolayer (SAM A), wherein SAM A comprises a dipole in the direction pointing away from the surface of the substrate holder.

16. The system of clause 15, wherein the tail-group of SAM A comprises one or more substituents selected from —BH2, —COOH, —CN, —F, —Cl, —Br, —I, —CX3, —CHX2 or —CH2X, wherein each instance of X is independently selected from F, Cl, Br or I.

17. The system of clause 15 or clause 16, wherein the end-group of SAM A is —BH2, —COOH, —CN, —F, —Cl, —Br, —I, —CX3, —CHX2 or —CH2X, wherein each instance of X is independently selected from F, Cl, Br or I.

18. The system of any one of clauses 15 to 17, wherein the burls comprise one or more of diamond-like carbon (DLC), diamond, graphite, SiSiC, SiC and/or CrN.

19. The system of any one of clauses 15 to 18, wherein the nobility of the burls comprising SAM A is greater than the nobility of equivalent burls without SAM A.

20. A substrate with a backside configured to act as a sacrificial anode when supported by a substrate holder in a lithographic apparatus, comprising a self-assembled monolayer (SAM B) on the backside of the substrate, wherein SAM B comprises a dipole pointing towards the substrate backside, wherein the nobility of the substrate backside is lower than the nobility of an equivalent substrate backside without SAM B.

21. The substrate of clause 20, wherein the tail-group of SAM B comprises one or more substituents selected from —CH3, —NH2 or —OH.

22. The substrate of clause 20 or clause 21, wherein the end-group of SAM B is —CH3, —NH2 or —OH.

23. A lithography apparatus configured to apply a radiation beam to a substrate, and configured to apply a self-assembled monolayer (SAM B) to the backside of the substrate.

24. The lithography apparatus of clause 23, wherein SAM B comprises a dipole pointing towards the substrate backside.

25. The lithography apparatus of clause 23 or clause 24, wherein the tail-group of SAM B comprises one or more substituents selected from —CH3, —NH2 or —OH.

26. The lithography apparatus of any one of clauses 23 to 25, wherein the end-group of SAM B is —CH3, —NH2 or —OH.

The descriptions above are intended to be illustrative, not limiting. Thus it will be apparent to one skilled in the art that modifications may be made to the invention as described without departing from the scope of the claims set out below.

The invention claimed is:

1. A system comprising:
a lithography substrate holder having burls comprising diamond-like carbon and/or diamond,
wherein at least a portion of the burls of the substrate holder comprise comprises a self-assembled monolayer (SAM A) configured to provide anti-corrosion benefits for the at least a portion of the burls,
wherein the SAM A comprises a dipole in the direction pointing away from the surface of the substrate holder to thereby
increase a nobility of the burls compared to a nobility of a backside of a wafer disposed on the substrate holder; and/or
to increase an electron volt difference between the burls and a backside of a wafer disposed on the substrate holder.

2. The system of claim 1, wherein a tail-group of SAM A comprises one or more substituents selected from —BH2, —COOH, —CN, —F, —Cl, —Br, —I, —CX3, —CHX2, and —CH2X, wherein each instance of X is independently selected from F, Cl, Br, and I.

3. The system of claim 1, wherein an end-group of SAM A is —BH2, —COOH, —CN, —F, —Cl, —Br, —I, —CX3, —CHX2 or —CH2X, wherein each instance of X is independently selected from F, Cl, Br, and I.

4. The system of claim 1, wherein a nobility of the burls comprising SAM A is greater than the nobility of equivalent burls without SAM A.

5. The system of claim 1, wherein the SAM A increases a work function of the burls of the substrate holder.

* * * * *